(12) United States Patent
Lin

(10) Patent No.: US 12,259,269 B2
(45) Date of Patent: Mar. 25, 2025

(54) AIRTIGHT-LEVEL SENSOR AND ELECTRONIC DEVICE INCLUDING THE SAME

(71) Applicant: Alpha Networks Inc., Hsinchu (TW)

(72) Inventor: Tzu-Chih Lin, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 396 days.

(21) Appl. No.: 17/942,201

(22) Filed: Sep. 12, 2022

(65) Prior Publication Data
US 2023/0175881 A1 Jun. 8, 2023

(30) Foreign Application Priority Data
Dec. 2, 2021 (TW) .................. 110144985

(51) Int. Cl.
*G01F 23/296* (2022.01)
*G01M 3/24* (2006.01)
*H05K 5/06* (2006.01)

(52) U.S. Cl.
CPC ............. *G01F 23/296* (2013.01); *G01M 3/24* (2013.01); *H05K 5/065* (2013.01)

(58) Field of Classification Search
CPC ........ G01M 3/24; G01F 23/28; G01F 23/296; G01F 23/2965; G01F 1/3227
See application file for complete search history.

(56) References Cited

U.S. PATENT DOCUMENTS

| 3,792,606 A * | 2/1974 | Munger | G01M 3/02 73/40 |
| 9,410,832 B2 * | 8/2016 | Richter | A61M 5/16827 |
| 9,610,388 B2 * | 4/2017 | Aceto | A61M 1/90 |

FOREIGN PATENT DOCUMENTS

| CN | 104296940 | 1/2015 |
| TW | 200821565 | 5/2008 |

* cited by examiner

*Primary Examiner* — Erika J. Villaluna
(74) *Attorney, Agent, or Firm* — WPAT, PC

(57) ABSTRACT

An airtight-level sensor includes an air pump, a sounding mechanism, and a processing device. The air pump comprises an inlet valve and an outlet valve, the sounding mechanism is disposed near the outlet valve to generate a sound wave corresponding to an airflow blown from the outlet valve, and the processing device is disposed near the sounding mechanism to receive the sound wave generated therefrom and determines an airtight-level of an airtight chamber wherein the airtight-level sensor is disposed.

15 Claims, 5 Drawing Sheets

AIRTIGHT-LEVEL SENSOR AND ELECTRONIC DEVICE INCLUDING THE SAME

FIELD OF THE INVENTION

The present invention relates to airtight-level detection, and more particularly to an airtight-level sensor, and an electronic device where an airtight-level sensor is used.

BACKGROUND OF THE INVENTION

In order not to be adversely affected by the external environment, electronic products are generally required to be waterproof. Therefore, during a manufacturing process of a product, the manufacturer would need to conduct certain tests, e.g., airtight-level detection, to support adequate water resistance. Conventionally, the airtight-level detection is performed with an airtight-level sensor specific to the product. In other words, a variety of sensors would be required for testing different kinds of products. It is apparently cost-ineffective and might result in limitations of tests.

Even if the product passes the airtight test and is claimed to be waterproof at first, the airtight level might still be deteriorated after a long-term or improper use. Neglect to such a fact might result in malfunction of the product provided that the product is still operated under an environment requiring a highly waterproof condition.

Therefore, it is an important issue for current technology to dynamically monitor an airtight level or waterproof level of a product.

SUMMARY OF THE INVENTION

The present invention provides an airtight-level sensor, whose structure is so simple as to be suitably installed in an electronic device.

The present invention further provides an electronic device, which is equipped with an airtight-level sensor for dynamically monitoring the airtight level of the electronic device.

In an aspect of the present invention, an airtight-level sensor is adapted to be use in an airtight object, and includes an air pump having an inlet valve and an outlet valve; a sounding mechanism disposed at the outlet valve, and generating a sound wave specific to an air flow out of the air pump through the outlet valve; and a processing device disposed adjacent to the sounding mechanism for receiving the sound wave, and evaluating an airtight level of the airtight object based on at least feature of the sound wave.

In another aspect of the present invention, an electronic device comprises a casing defining an accommodation room; a main processor, disposed in the accommodation room; and an airtight-level sensor. The airtight-level sensor includes an air pump having an inlet valve and an outlet valve; a sounding mechanism disposed at the outlet valve, and generating a sound wave specific to an air flow out of the air pump through the outlet valve; and a processing device disposed adjacent to the sounding mechanism for receiving the sound wave, and evaluating an airtight level of the electronic device based on at least feature of the sound wave. The processing device is in communication with the main processor, and the airtight level evaluated by the processing device of the airtight-level sensor is provided for the main processor of the electronic device.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

It is to be noted that the term "electrically coupling" is used for indicating that electronic signals can be transmitted between two members electrically coupled to each other. Unless specified in other ways, the transmission of electronic signals may be conducted in either wired or wireless manner, and in either uni- or bi-directional way.

Figure 1:
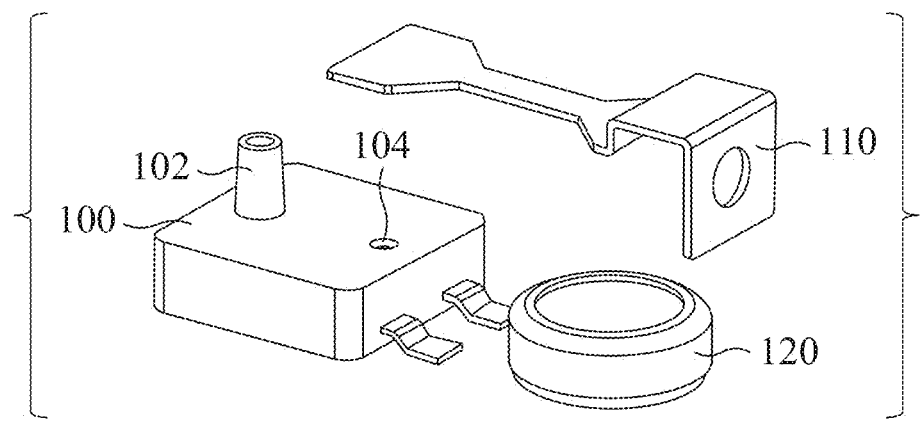
FIG. 1 is an exploded diagram schematically illustrating an airtight-level sensor according to an embodiment of the present invention.
Figure 2:
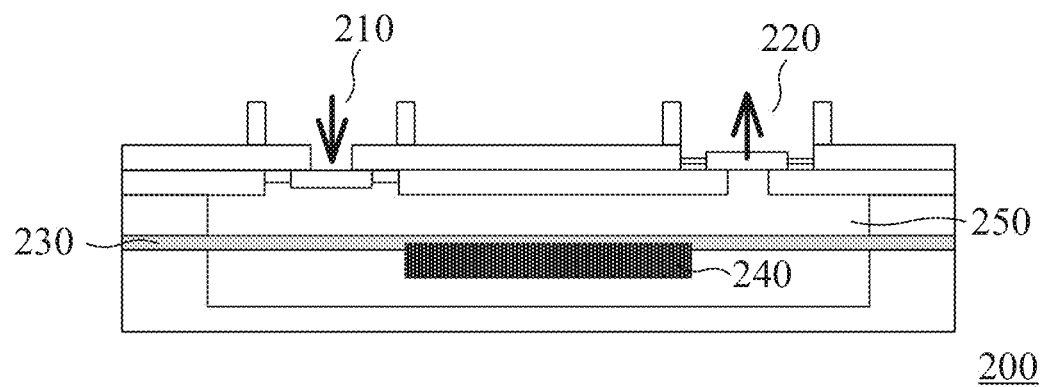
FIG. 2 is a schematic cross-sectional view of an air pump adapted to be included in the airtight-level sensor of FIG. 1.

Please refer to FIG. 1, which is an exploded diagram schematically illustrating an airtight-level sensor according to an embodiment of the present invention. In this embodiment, the airtight-level sensor 10 includes an air pump 100, a sounding mechanism 110, and a processing device 120. As shown, the air pump 100 has an inlet valve 102 and an outlet valve 104, wherein air can flow into the interior of the air pump 100 through the inlet valve 102, and flow out of the air pump 100 through the outlet valve 104. The air pump 100 may be any practical device capable of performing the required functions. For example, an air pump 200 as shown in FIG. 2, which is a miniature air pump that operates by a piezoelectric effect, may be used in the airtight-level sensor 10. The exemplified air pump 200 has an inlet valve 210 disposed at an upper side and serving as a channel for a fluid, e.g., air, to enter the air pump 200. Also at the upper side of the air pump 200 and separate from the inlet valve 210, an outlet valve 220 is disposed for serving as a channel for the fluid to leave the air pump 200. Furthermore, the air pump 200 has therein a diaphragm 230, which divides the interior of the air pump 200 into an upper space and a lower space. An actuator 240 is disposed in the lower space under the diaphragm 230, which is isolated from the inlet valve 210 and the outlet valve 220. In contrast, the upper space above the diaphragm 230, which is defined as a pump chamber 250, is communicable with the inlet valve 210 and the outlet valve 220. In a suction process of the air pump 200, the actuator 240 pulls the diaphragm 230 down so as to enlarge the space of the pump chamber 250. Then, due to the pressure drop in the pump chamber 250, air outside the air pump 200 enters the pump chamber 250 through the inlet valve 210. On the contrary, in a ventilation process of the air pump 200, the actuator 240 restores the diaphragm 230 to the original level, and thus the space of the pump chamber 250 becomes small relative to the one in the suction process. Therefore, the air pressure in the pump chamber 250 increases, and accordingly, air inside the pump chamber 250 leaves the air pump 200 through the outlet valve 220.

Please refer to FIG. 1 again. The sounding mechanism 110 of the airtight-level sensor 10 outputs a sound wave specific to the air flow from the outlet valve 104. The processing device 120 of the airtight-level sensor 10 adjacent to the sounding mechanism 110 then receives the sound wave and evaluates the in-situ airtight level based on the features of the sound wave. The features of the sound wave include, but are not limited to, frequency, duration, etc. For example, when the environment, where the airtight-level sensor 10 is located, is in a state of near vacuum, i.e., almost no air exists, extremely little air flows through the outlet valve 104. Under this circumstance, the sound wave generated by the sounding mechanism 110 would have extremely short duration and/or extremely low frequency. Likewise, with a high airtight level, air in the airtight-level sensor 10 would not increase significantly, and the features of the sound wave generated by the sounding mechanism 110 would not significantly change. On the contrary, once the airtight level of the environment, where the airtight-level sensor 10 is located, is deteriorated and becomes dissatisfactory, the amount of air flow through the valve would significantly change. As a result, the features of the sound wave generated by the sounding mechanism 110 would change to a certain extent. Thus the processing device 120 can evaluate the in-situ airtight level.

In an embodiment, the sounding mechanism 110 is implemented with a reed, which vibrates at different levels in response to different amounts of air flow. It is to be noted, however, any other mechanism that can generate a sound wave varying with an amount of air flow can also be used herein as the sounding mechanism 110.

Figure 3:
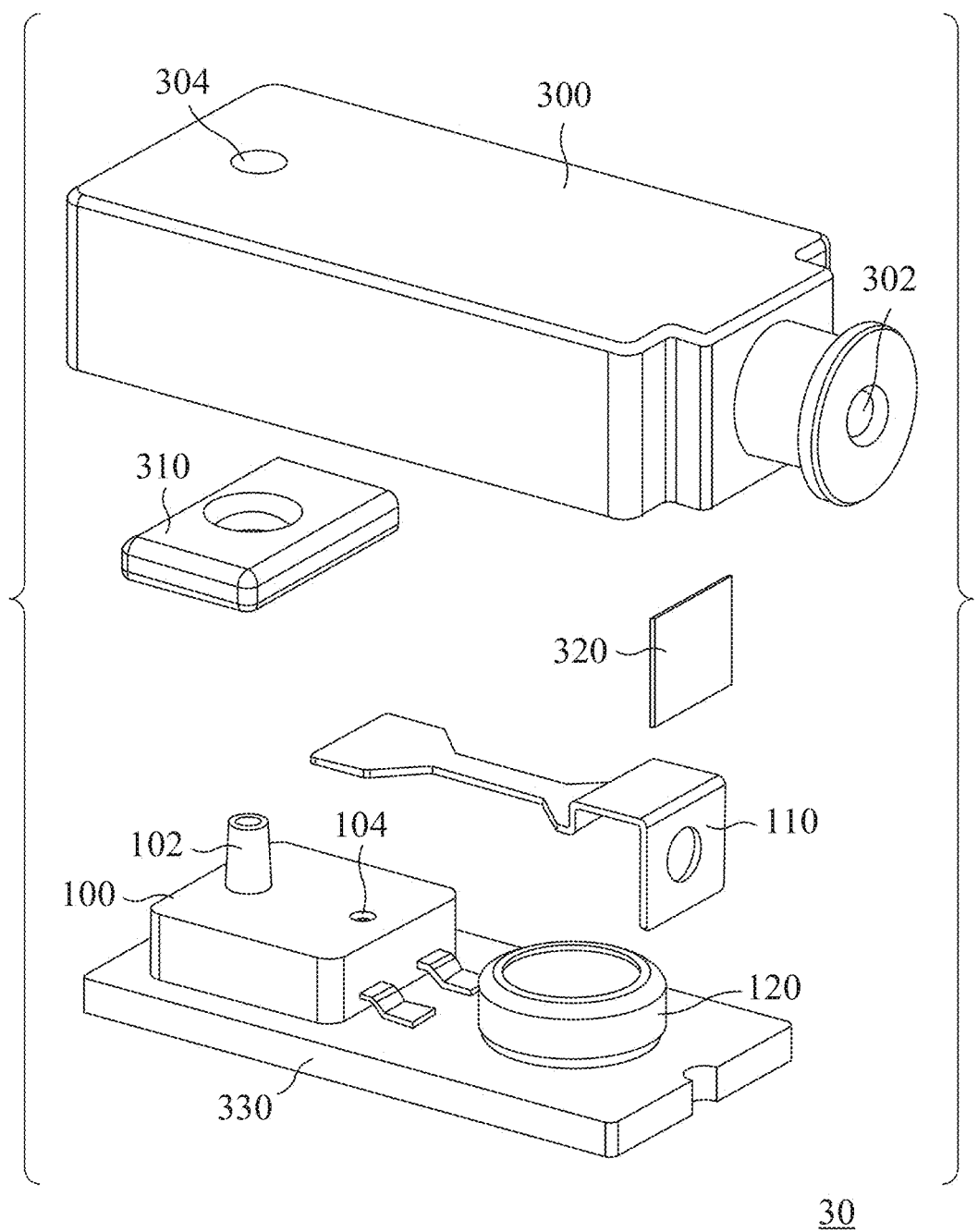
FIG. 3 is an exploded diagram schematically illustrating an airtight-level sensor according to another embodiment of the present invention.
Figure 4:
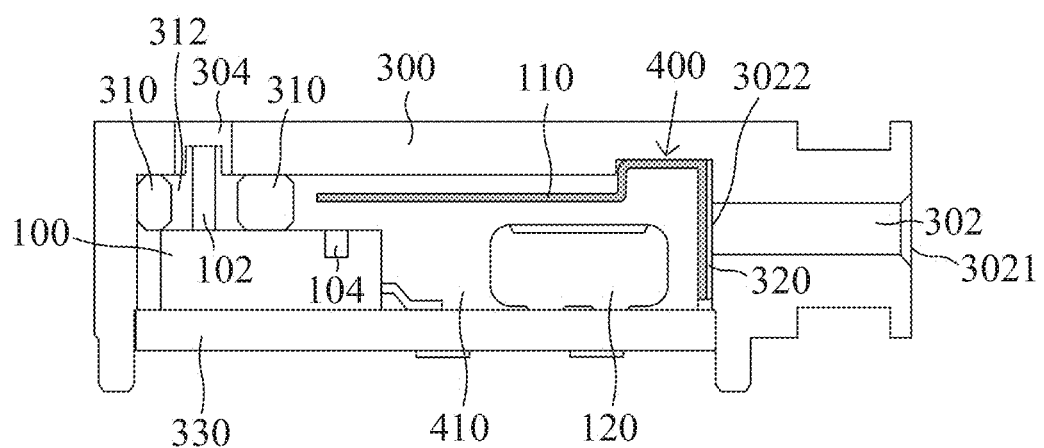
FIG. 4 is a schematic cross-sectional view of the airtight-level sensor of FIG. 3.

Afterwards, please refer to FIGS. 3 and 4, in which an exploded view and a cross-sectional view of an airtight-level sensor according to another embodiment of the present invention are schematically shown.

The airtight-level sensor 30 as shown in FIGS. 3 and 4 includes the air pump 100, sounding mechanism 110 and processing device 12, which are previously described with reference to FIG. 1. These elements are accommodated in a room 410 enclosed with a housing cover 300 and a housing base 330 engaging with each other. The housing cover 300 has two via holes 302 and 304. The via hole 302 and the via hole 304 respectively penetrate through walls of the housing cover 300. The via hole 302 has a first opening 3021 leading to the external environment, and a second opening 3022 leading into the room 410, and the via hole 304 is aligned and communicable with the inlet valve 102 of the air pump 100. In this embodiment, a sealant gel 310 is applied to surround the inlet valve 102 and isolate the inlet valve 102 from the outlet valve 104. In this way, even if the via hole 304 is not directly connected to the inlet valve 102 or does not fit the size of the inlet valve 102, the air flow out of the outlet valve 104 can still be blocked from directly entering the inlet valve 102. It is because the chamber 312, where the inlet valve 102 is disposed, is enclosed with the sealant gel 310, the housing cover 300 and the air pump 100, so as to be the only air flow channel to the inlet valve 102.

In addition to the above-described elements, a water-resistant air-permeable film 320 is included in the airtight-level sensor 30 and disposed at an inner opening the via hole 302 to prevent water from entering the room 410 through the via hole 302.

Furthermore, the air pump 100 and the processing device 120 are mounted onto the housing base 330. The sounding mechanism 110, e.g., the reed, is specifically shaped in conformation to the configuration of the housing cover 300. In this embodiment as shown in FIGS. 3 and 4, the reed 110 is bent to be an inverted L-shape, wherein a free end of the reed 110 suspends above the outlet valve 104, an intermediate section of the reed 110 is secured to an inner recess 400 on a top wall of the housing cover 300, and another end section of the reed 110 is secured to a side wall of the housing cover. Although the detailed structures of the sensor are specifically described as above, it is understood that they are described for illustration only. Any suitable securing mechanism can be used in the present invention as long as the securing objects can be achieved. It is not necessary to limit the technical implementation of the invention.

Figure 5:
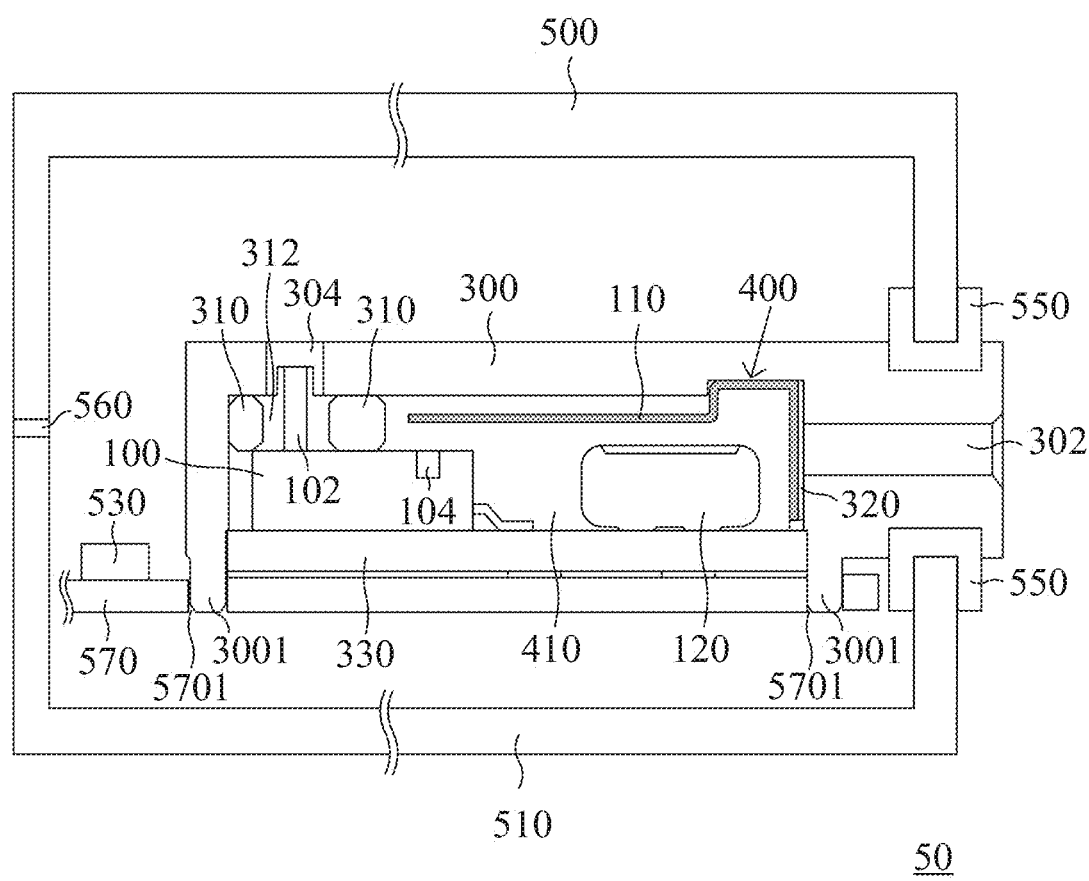
FIG. 5 is a schematic cross-sectional view of an electronic device according to an embodiment of the present invention, where an airtight-level sensor is used.

Please refer to FIG. 5, which schematically illustrates an electronic device having an airtight-level sensor according to an embodiment of the present invention. In this embodiment, a casing of the electronic device 50 includes an upper housing 500 and a lower housing 510. The space between the upper housing 500 and the lower housing 510 is defined as an accommodation room, in which a plurality of electronic elements are installed. The electronic elements, for example, includes a main processor 530, a main board 570, and an airtight-level sensor such as the airtight-level sensor 30 illustrated in FIG. 3. The main processor 530 is mounted on the main board 570. The housing cover 300 of the airtight-level sensor 30 are also secured onto the main board 570, for example, with piles 3001 that are inserted into specifically located holes 5701 of the main board 570.

In the embodiment of electronic device 50 shown in FIG. 5, a sealant gel 560 is applied to a seam between the upper housing 500 and the lower housing 510 for assuring of airtightness. Likewise, a sealant gel 550 is applied to a seam between the housing cover 300 and the upper housing 500 as well as a seam between the housing cover 300 and the lower housing 510 to improve airtightness. The sealant gel 550 is, for example, applied to the outer wall of the via hole 302 of the airtight-level sensor 30, where the upper housing 500 and the lower housing 510 of the electronic device 50 are connected. Therefore, the sealant gel 550 is shaped to conform to the outer wall of the via hole 302 and the upper/lower housings 500 and 510 of the electronic device 50.

With the above-described structure, during operation of the airtight-level sensor 30, the air pump 100 sucks in the air from the electronic device 50 through the via hole 304 and the inlet valve 102, and meanwhile, ventilates the air exhausted through the outlet valve 104 out of the electronic device 50 through the via hole 302. Basically, the electronic device 50 has a certain level of airtightness. After the air pump 100 has been operated for a specified period of time, the total amount of air penetrating into the accommodation room of the electronic device 50 through seams and the total amount of air ventilated out of the electronic device 50 through the via hole 302 would achieve a balance. In other words, the features of the sound wave generated by the sounding mechanism 110 would gradually become stable. Accordingly, the airtight-level sensor 30 can determine the airtight-level of the electronic device 50 based on the variation of the features of the sound wave generated by the sounding mechanism 110.

For readily determining an airtight level of the electronic device 50 with the airtight-level sensor 30, the main processor 530 of the electronic device 50 is electrically coupled to the processing device 120 of the airtight-level sensor 30 so that the processing device 120 can send the detected information of airtight level to the main processor 530 in an electronically transmitting manner. The main processor 530 then informs the user of the detected airtight level. For example, the main processor 530 may be electrically coupled to and output a voice to a speaker, or electrically coupled to and drive a display, to notify the airtight level and alarm an abnormal airtight level.

Figure 6:
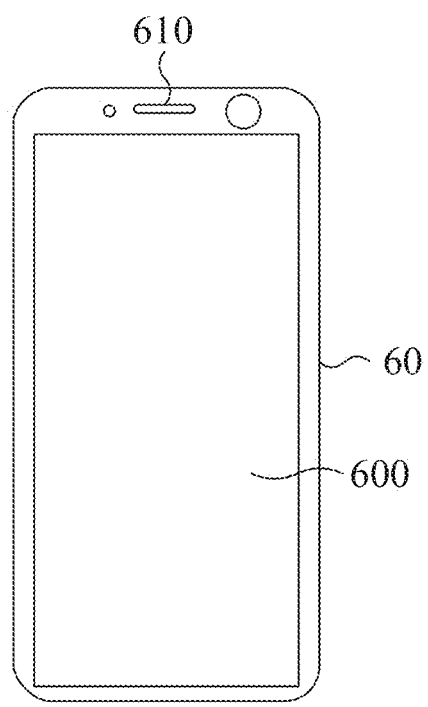
FIG. 6 is a schematic diagram illustrating an example of electronic device according to an embodiment of the present invention.

The speaker or display mentioned above may be an external device independent from the electronic device 50. Alternatively, the speaker or display may be parts of or integrated into the electronic device 50. For example, FIG. 6 schematically illustrates a smartphone, which is exemplified as the electronic device 50. The smartphone 60 includes a display 600 and a speaker 610. In this case, the aright level of the electronic device 50 can be directly revealed by the electronic device 50 itself.

It is understood from the above that the airtight level of an electronic device can be readily and dynamically monitored with an airtight-level sensor according to the present invention. No troublesome and costly retrofit of the electronic device is required. Instead, by simply installing an airtight-level sensor developed according to the present invention into the electronic device, the airtight level can be readily and dynamically monitored. Once a significant change of airtightness is detected, remedy can be conducted as soon as possible to avoid severe problems like damage of the electronic device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An airtight-level sensor for use in an airtight object, comprising:
   an air pump having an inlet valve and an outlet valve, wherein the inlet valve is in communication with an accommodation room of the airtight object, and the outlet valve is in communication with the inlet valve;
   a sounding mechanism disposed at the outlet valve, and generating a sound wave specific to an air flow entering the inlet valve of the air pump from the accommodation room of the airtight object and exiting out of the outlet valve of the air pump; and
   a processing device disposed adjacent to the sounding mechanism for receiving the sound wave, and evaluating an airtight level of the airtight object based on at least a feature of the sound wave.

2. The airtight-level sensor according to claim 1, further comprising:
   a first sealant gel surrounding the inlet valve for isolating the inlet valve from the outlet valve, thereby preventing the air flow out of the outlet valve from directly entering the inlet valve.

3. The airtight-level sensor according to claim 1, further comprising:
   a housing cover having a first via hole and a second via hole, each of which penetrates through a wall of the housing cover, wherein a first opening of the first via hole is uncovered from the airtight object, and the second via hole is aligned and communicable with the inlet valve of the air pump;
   a housing base mounted thereon the air pump and the processing device, and engaging with the housing cover for defining an enclosed room, where the air pump, the sounding mechanism and the processing device are disposed; and
   a water-resistant air-permeable film, which is disposed at a second opening of the first via hole to prevent water from entering the enclosed room through the first via hole.

4. The airtight-level sensor according to claim 3, wherein the sounding mechanism includes a reed, which is secured to an inner wall of the housing cover, and has a free end suspending above the outlet valve and vibrating at different levels in response to different amounts of the air flow.

5. The airtight-level sensor according to claim 1, wherein the air pump is a miniature air pump that operates by a piezoelectric effect.

6. The airtight-level sensor according to claim 1, wherein at least one feature of the sound wave includes frequency and/or duration of the sound wave.

7. An electronic device, comprising:
   a casing defining an accommodation room;
   a main processor, disposed in the accommodation room; and
   an airtight-level sensor, comprising:
      an air pump having an inlet valve and an outlet valve, wherein the inlet valve is in communication with an accommodation room of the airtight object, and the outlet valve is in communication with the inlet valve;
      a sounding mechanism disposed at the outlet valve, and generating a sound wave specific to an air flow entering the inlet valve of the air pump from the accommodation room of the airtight object and exiting out of the outlet valve of the air pump; and
      a processing device disposed adjacent to the sounding mechanism for receiving the sound wave, and evaluating an airtight level of the electronic device based on at least a feature of the sound wave,
   wherein the processing device is in communication with the main processor, and the airtight level evaluated by the processing device of the airtight-level sensor is provided for the main processor of the electronic device.

8. The electronic device according to claim 7, wherein the airtight-level sensor further comprises:
   a first sealant gel surrounding the inlet valve for isolating the inlet valve from the outlet valve, thereby preventing the air flow out of the outlet valve from directly entering the inlet valve.

9. The electronic device according to claim 7, wherein the airtight-level sensor further comprises:
   a housing cover having a first via hole and a second via hole, each of which penetrates through a wall of the housing cover, wherein a first opening of the first via hole is uncovered from the casing of the electronic device, and the second via hole is aligned and communicable with the inlet valve of the air pump;
   a housing base mounted thereon the air pump and the processing device, and engaging with the housing cover for defining an enclosed room, where the air pump, the sounding mechanism and the processing device are disposed; and a water-resistant air-permeable film, which is disposed at a second opening of the first via hole to prevent water from entering the enclosed room through the first via hole.

10. The electronic device according to claim 9, wherein the sounding mechanism includes a reed, which is secured to an inner wall of the housing cover, and has a free end suspending above the outlet valve and vibrating at different levels in response to different amounts of the air flow.

11. The electronic device according to claim 9, further comprising a second sealant gel interposed between the housing cover of the airtight-level sensor and the casing.

12. The electronic device according to claim 7, wherein the air pump is a miniature air pump that operates by a piezoelectric effect.

13. The electronic device according to claim 7, wherein the main processor is electrically coupled to and outputs a voice to a speaker to notify the airtight level and/or alarm an abnormal airtight level.

14. The electronic device according to claim 7, wherein the main processor is electrically coupled to and drives a display to notify the airtight level and/or alarm an abnormal airtight level.

15. The electronic device according to claim 7, wherein at least one feature of the sound wave includes frequency and/or duration of the sound wave.

* * * * *